United States Patent [19]
Otto et al.

[11] 3,999,147
[45] Dec. 21, 1976

[54] TEMPERATURE STABLE SURFACE ACOUSTIC WAVE AND OSCILLATOR USING THE DEVICE

[75] Inventors: Oberdan W. Otto; Rolf D. Weglein, both of Los Angeles, Calif.

[73] Assignee: Hughes Aircraft Company, Culver City, Calif.

[22] Filed: Oct. 31, 1975

[21] Appl. No.: 627,801

[52] U.S. Cl. .................. 331/107 A; 310/9.8; 331/176; 333/30 R; 333/72
[51] Int. Cl.² .................. H03B 5/32; H03H 9/20; H03H 9/26
[58] Field of Search .................. 331/107 A, 176; 330/5.5; 333/30 R, 72; 310/8.9, 9.5, 9.7, 9.8

[56] References Cited
UNITED STATES PATENTS

| 3,568,102 | 3/1971 | Tseng | 331/107 A X |
| 3,883,831 | 5/1975 | Williamson et al. | 333/30 R |
| 3,886,484 | 5/1975 | Dias et al. | 331/107 A |
| 3,889,205 | 6/1975 | Mitchell | 331/107 A X |

*Primary Examiner*—Siegfried H. Grimm
*Attorney, Agent, or Firm*—John Holtrichter, Jr.; W. H. MacAllister

[57] ABSTRACT

A temperature stable surface acoustic wave device utilizing reflective gratings in a material such as Y-cut quartz having two propagation directions in which the temperature coefficients of delay are of opposite sign, the gratings reflecting the Rayleigh waves in the two propagation directions along suitable path lengths to provide a total linear zero temperature coefficient of delay. A temperature stable oscillator is formed by providing an amplifier in a feedback path from the output transducer to the input transducer of the surface acoustic wave device.

17 Claims, 8 Drawing Figures

TEMPERATURE STABLE SURFACE ACOUSTIC WAVE AND OSCILLATOR USING THE DEVICE

BACKGROUND OF THE INVENTION

The background of the invention will be set forth in two parts.

1. Field of the Invention

The invention relates to surface acoustic wave devices, and more particularly to such devices having temperature stability.

2. Description of the Prior Art

In recent years there has been much interest in techniques for achieving zero temperature coefficient of delay (TCD) in surface acoustic wave structures. One such technique is to choose a crystalline cut and orientation which has zero TCD, as described in an article entitled "The Temperature Coefficient of Delay-Time for X-Propagating Acoustic Surface-Waves on Rotated Y-Cuts of α Quartz," by J. F. Dias, H. E. Karrer, J. A. Kusters, J. H. Matsinger, and M. B. Shultz, in *IEEE Transactions on Sonics and Ultrasonics*, SU-22, pages 46–50 (1975). Another technique was to use film overlays on the propagating surface to constrain the TCD, as described in a paper by T. E. Parker and M. B. Shultz, "SiO$_2$ Film Overlays for Temperature-Stable Surface Acoustic Wave Devices," in *Applied Physics Letters*, Vol. 26, pages 75–77 (1975). The desired zero temperature coefficient of delay has also been provided by applying an external strain to a crystal, as described by M. Toda and S. Osaka in an article entitled "Temperature-Independent-Time-Delay Surface Acoustic-Wave Device Using a LiNbO$_3$-Bimetallic Plate Structure," in the *IEEE Transactions on Sonics and Ultrasonics*, Vol. SU-22, pages 39–45 (1975). Further, the use of bonded acoustic composites has been proposed by Michael T. Wauk in an article entitled "LiNbO$_3$-Quartz-LiNbO$_3$ Composite Delay Line With Zero Linear Temperature Coefficient of Delay" in *Electronics Letters*, Vol. 10, pages 109–110 (1974). In the first three above-mentioned techniques, the temperature characteristics are fixed in the initial fabrication, while in the fourth, path length tradeoff is possible, but fabrication of the bonded composite structure is difficult.

An advantageous end use of such zero TCD surface acoustic wave structures is a temperature-stable feedback oscillator. Such oscillators using surface acoustic wave filters on ST quartz are currently receiving considerable attention. This is due in large measure to the planar, rugged and cost-effective features with which these oscillators can be built, well into the microwave frequency range. For more complete background in this area, reference may be had to an article by M. F. Lewis entitled "Some Aspects of SAW Oscillators" in 1973, *IEEE Ultrasonics Symposium Proceedings*, IEEE Cat. No. 73CH0807-8SU, Monterey, California, page 344. The frequency-determining component in these devices is a pair of thin-metal-film (usually Al) interdigital transducers spaced at a particular delay distance on the quartz substrate, so that the resulting narrow band filter characteristic selects only one from the many possible modes for feedback oscillation.

In conventional feedback oscillator filters the transducer patterns that produce mode selection generally require large fractional metallizations along the acoustic paths proportional to the oscillator Q. At higher Q's and at high frequencies, cumulative coherent reflections from many periodically spaced metal fingers and excess propagation loss due to large fractional metallizations become prohibitive. In addition, the temperature stable turnaround point on ST quartz (nominally 25° C for a free x-propagating ST quartz surface) decreases rapidly to the negative centigrade range with increasing metal coverage and thickness. Corrective measures have been proposed to at least partially alleviate or compensate for these phenomena. For more complete data in this area, reference may be had to the above-noted Lewis article, the Dias et al article, and such articles as "Design of Harmonic Surface Acoustic Wave (SAW) Oscillators Without External Filtering and New Data on the Temperature Coefficient of Quartz" by S. J. Kerbel in the 1974 *IEEE Ultrasonics Symposium Proceedings*, IEEE Cat. No. 74CH0896-1SU, Milwaukee, Wisconsin, page 276, and an article by M. B. Shultz, B. J. Matsinger, and M. G. Holland, entitled "Temperature Dependence of Surface Acoustic Wave Velocity on α Quartz" in the *Journal of Applied Physics*, Vol 41, page 2755 (1970).

SUMMARY OF THE INVENTION

In view of the foregoing factors and conditions characteristic of the prior art, it is a primary object of the present invention to provide an improved temperature stable surface acoustic wave device.

Another object of the present invention is to provide a temperature stable surface acoustic wave device incorporating reflective gratings to cause propagating energy to follow predetermined path segments having temperature coefficients of delay of opposite sign.

Still another object of the present invention is to provide a surface acoustic wave delay line having temperature stable characteristics.

Still a further object of the present invention is to provide a temperature stable surface acoustic wave device having a turn-around temperature that can be adjusted by small changes in the propagation path segment length ratio.

Yet another object of the present invention is to provide a surface acoustic wave oscillator using reflective wave gratings.

Yet a further object of the present invention is to provide a new surface acoustic wave oscillator that utilizes a pair of periodic ion-etched gratings disposed on Y-cut quartz as frequency determining elements in a temperature stable mode, the temperature stability being achieved independently of the metallized transducer film thickness and area.

In accordance with one embodiment of the present invention, a temperature stable surface acoustic wave device includes input means including an input transducer disposed on a substrate of material capable of supporting propagating surface acoustic wave energy in two directions in which the temperature coefficients of delay are of opposite sign, for converting input electromagnetic energy to surface acoustic wave energy in the substrate and for causing the surface acoustic wave energy to propagate in one of the aforementioned directions. The invention includes output means having an output transducer disposed on the substrate for converting surface acoustic wave energy incident thereon to output electromagnetic energy. Also, the invention includes reflective grating means disposed on the substrate for reflecting surface acoustic wave energy from the input transducer propagating in the first-mentioned direction to the other of the aforementioned directions, and for directing the surface acoustic wave energy toward the output transducer. The path lengths of the surface acoustic wave energy propagating along the two directions are predetermined to provide a total linear zero temperature coefficient of delay in the device.

The reflective grating means may include a single periodic grating which defines an L path configuration, or a Z or U path may be defined by two spaced periodic or non-periodic gratings. Further, any of these configurations may be utilized to provide a very advantageous new type of temperature stable surface acoustic wave feedback oscillator.

The features of the present invention which are believed to be novel are set forth with particularity in the appended claims. The present invention, both as to its organization and manner of operation, together with further objects and advantages thereof, may best be understood by making reference to the following description, taken in conjunction with the accompanying drawings, in which like reference characters refer to like elements in the several views.

DESCRIPTION OF THE PREFERRED EMBODIMENTS

The surface acoustic wave device in accordance with the basic concepts of the invention achieves zero temperature coefficient of delay (TCD) by having the surface acoustic wave propagate in two directions which have TCD coefficients of the opposite sign. Total linear zero TCD is achieved by arranging the path lengths in the two directions so that all contributions to the change in phase delay with temperature sum to zero. The surface acoustic wave is reflected from one path to the other by means of one or two reflective surface acoustic wave gratings which define, respectively, an L-shaped path and either a Z-shaped path or a U-shaped path. In other words, reflective grating means is provided for segmenting the propagation path of a surface acoustic wave so that the sum effect of the temperature variation of phase delay of all the segments and the phase contributions by the gratings is zero.

Figure 1:
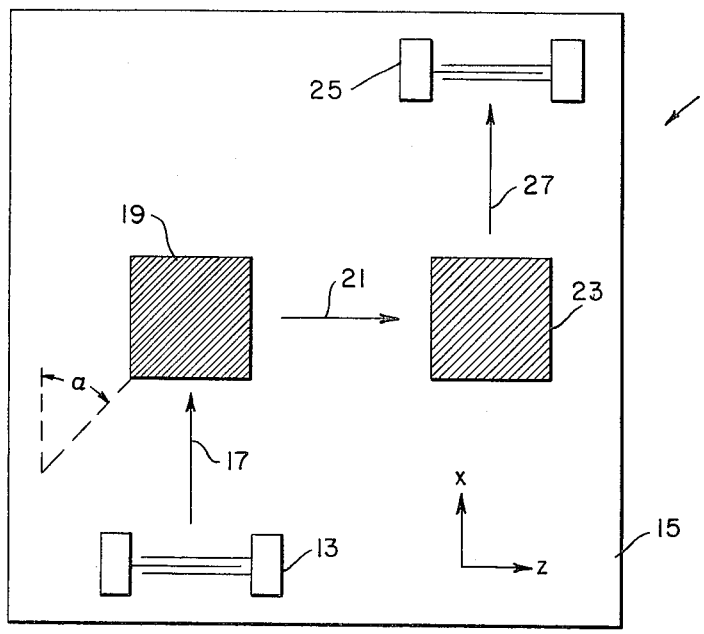
FIG. 1 is a schematic plan view of a temperature stable surface acoustic wave delay line having a Z-shaped propagation path, in accordance with one embodiment of the present invention.

A typical temperature stable surface acoustic wave device 11 is illustrated in FIG. 1. Here, a surface acoustic wave is launched by a conventional input transducer 13 disposed on a substrate 15 of a material, such as Y-cut quartz, for example, that is capable of supporting propagating surface acoustic wave energy in the X and Z directions in which the temperature TCD's are of opposite sign. The input transducer 13 directs the surface acoustic wave along a first path segment 17 in the X direction. The wave is then reflected by a first conventional reflective grating 19 into a second path segment 21 in the Z direction toward a second conventional reflecting grating 23 where it is reflected to propagate toward a conventional output transducer 25 along a third path segment 27 back into the X direction. The delay along each of the three segments of the Z-shaped path will vary with temperature. Since the sense of the temperature variation along the second segment 21 is opposite to that of the other two segments (17 and 27), zero total variation is achieved by the correct choice of the relative path lengths along the X and Z directions.

In general, the reflection need not be through 90° as illustrated in FIG. 1, but the theory becomes somewhat involved for other angles and will be presented later. For a 90° reflection, the equations do reduce to a manageable form. The total phase delay, $\tau$, is $$\tau = L_x/v_x + L_z/v_z = \tau_x + \tau_z, \quad (1)$$

where $L_x$ and $L_z$ are the propagation path lengths along X and Z, $v_x$ and $v_z$ are the phase velocities along X and Z, and $\tau_x$ and $\tau_z$ are the respective delays for the two directions. For the general theory it can be shown that the total temperature coefficient of delay, $\Gamma_\tau$, is $$\Gamma_T = \frac{\tau_x}{\tau}\gamma_{T x} + \frac{\tau_z}{\tau}\gamma_{T z} - \frac{\tau_z}{\tau}\frac{\beta\tan\alpha}{1-\beta\tan\alpha}[(\gamma_{vz}-\gamma_{vx})+(\gamma_{Lx}-\gamma_{Lz})\cos 2\alpha] \quad (2)$$

where $\tan\alpha = v_z/v_x$, $$\beta = \frac{\delta v_z}{\delta\theta}/v_z,$$

and $$\gamma_{a_i} = \frac{\delta a_i}{\delta T}/a_i.$$

In words, $\alpha$ is the grating angle required to achieve a 90° reflection, $\beta$ is the first order velocity anisotropy along the z direction, and $\gamma$'s are the temperature coefficients for delay ($\tau$), velocity ($v$), and expansion (L) along the x and z directions. If z is a pure mode direction then $\beta=0$ and equation (2) reduces to the intuitive form $$\Gamma_T = \frac{\tau_x}{\tau}\gamma_{T x} + \frac{\tau_z}{\tau}\gamma_{T z}. \quad (3)$$

which says that the total temperature coefficient of delay $\Gamma_\tau$ is the weighted average of the coefficients for the $x$ and $z$ directions. The complications for cases where $z$ is not a pure mode direction ($\beta \neq 0$) or where the reflection is not through exactly 90° ($\tan\alpha \neq v_z/v_x$) arise because the grating angle $\alpha$ varies with temperature.

Referring again to equation 3, if $\gamma_{\tau x}$ and $\gamma_{\tau z}$ have opposite signs then it is possible to choose $\tau_x/\tau_z$ so that $\Gamma_\tau = 0$. Y-cut quartz is a particular material cut where this relationship is true ($\gamma_{\tau x} = -24 \times 10^{-6}/°$ C, $\gamma_{\tau z} = +62 \times 10^{-6}/°$ C).

In accordance with another embodiment 31 of the invention, surface acoustic wave energy leaving an input transducer 33 along a first path segment 35 in the X direction is reflected by a first grating 37 to propagate along a second path segment 39 in the Z direction toward a second grating 41. The latter grating reflects the wave along a third path segment 43 again in the X direction toward an output transducer 45. In this arrangement, the three path segments are in the shape of a U, but the operation is identical to that of embodiment 15 which utilizes a Z path. The gratings in the first two embodiments may either be periodic or non-periodic depending on the bandwidth and shape desired.

Figure 3:
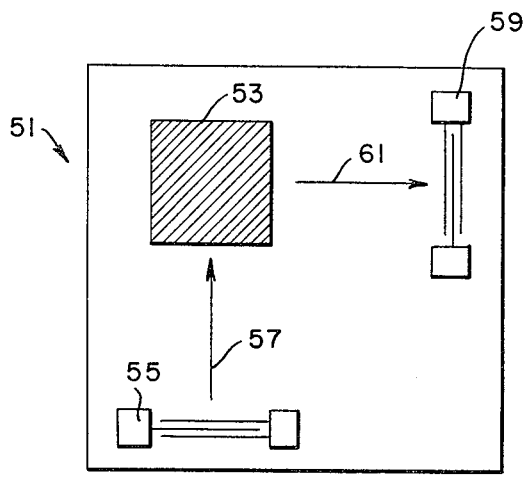
FIG. 3 is a schematic plan view of another embodiment of the invention utilizing single reflective grating defining an L-shaped propagation path.

FIG. 3, on the other hand, shows a third embodiment 51 utilizing only a single reflective periodic grating 53 to define an L path configuration. Here, surface acoustic wave energy launched by an input transducer 55 along the first path segment 57 in the X direction is reflected toward an output transducer 59 along the path segment 61 in the Z direction. As in the first two embodiments described previously, where the sense of the temperature variation along one or more segments is opposite to the sense of the temperature variation along another segment, zero total variation is achieved by the correct choice of the relative path lengths along the X and Z directions.

One important use for temperature stable surface acoustic wave structures is in temperature-stable feedback oscillators. The invention contemplates such an oscillator on Y-cut quartz that utilizes a pair of periodic ion-etched gratings as frequency determining elements in a temperature-stable mode. The thin film transducers in this device act solely to achieve efficient electroacoustic conversion. Temperature stability is achieved independent of the metallized transducer film thickness and area. The turn-around temperature, $T_o$, where the linear temperature coefficient of delay (or frequency) vanishes, may be varied by a simple predictable change in delay path lengths. This is an aspect of the delay line structure and is not limited to oscillators.

In conventional feedback oscillator filters, the transducer patterns that produce mode selection generally require large fractional metallizations along the acoustic path proportional to the oscillator Q. At higher Q's and at higher frequencies, cumulative coherent reflections from many periodically spaced metal fingers and excess propagation loss due to large fractional metallizations become prohibitive. In addition, the temperature stable turnaround point on ST quartz (nominally 25° C for a free x-propagating ST quartz surface) decreases rapidly to the negative centigrade range with increasing metal coverage and thickness. Corrective measures have been proposed to at least partially alleviate or compensate for these phenomena, but in the grating oscillator of the invention, these effects are avoided entirely.

Figure 4:
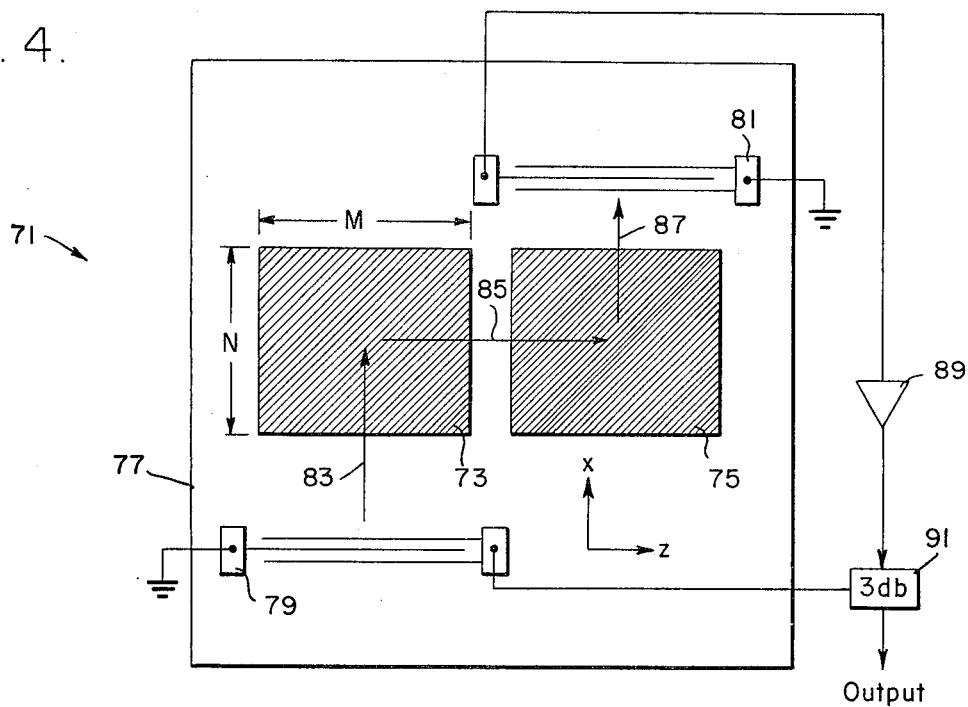
FIG. 4 illustrates a periodic grating oscillator employing a pair of gratings defining a Z-path configuration, in accordance with a presently preferred embodiment of the present invention.

An example of a periodic grating oscillator incorporating the invention is shown schematically in FIG. 4, and is identified by reference numeral 71. This device employs a pair of ion-etched gratings 73 and 75 disposed on Y-cut quartz 77 in a Z-path configuration between an input interdigital transducer 79 and an output interdigital transducer 81. The functions of the gratings are twofold; a) the configuration permits the acoustic beam to pass from the crystal orientation to $+x$ along a first path segment 83 to $+z$ along a second path segment 85 to $+x$ along a third path segment 87, thus coupling two propagating directions along which the temperature coefficient of delay (TCD) exhibits opposite signs. The relative delays along these two directions are arranged such that the total linear TCD is made to vanish; b) the grating periodicity along the z-direction determines the filter frequency, the grating width M (along Z) defines the filter bandwidth, and the grating area (M × N) determines the reflective efficiency. For more detailed information regarding Z path configurations and the reflective efficiency of gratings, reference may be had to an article by the coinventors entitled "Characteristics of Periodic Acoustic-Surface Wave Grating Filters," in *Electronic Letters*, Vol. 10, page 68 (1974), and to an article by O. W. Otto entitled "Multiple Reflections in Acoustic Surface Wave Reflective Arrays," published in the *IEEE Transactions of Sonics and Ultrasonics*, Vol. SU-22, page 251 (1975).

Figure 5:
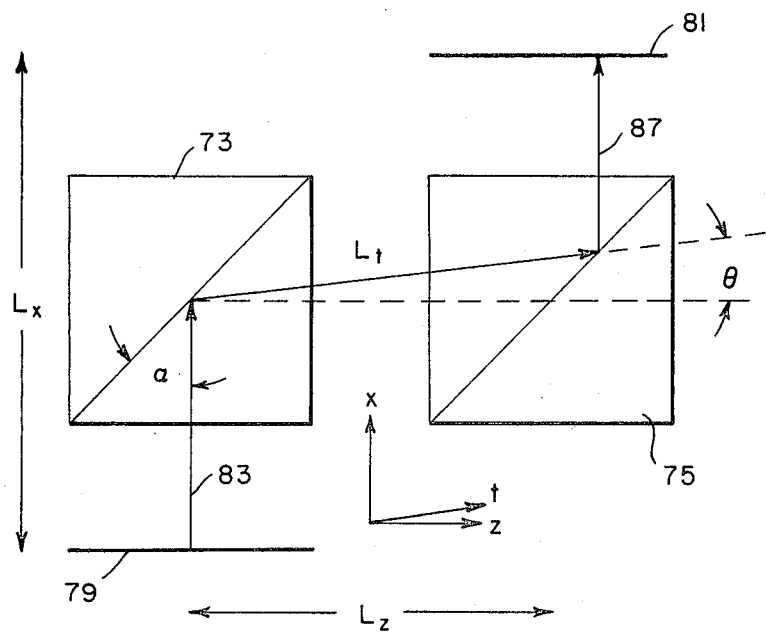
FIG. 5 is a schematic representation of the general geometry of the gratings shown in FIG. 4 where rotation of the reflectors is caused by temperature changes and where velocity anisotropy about the reflected directions is taken into account.

As noted previously, the concept that the total differential in delay with temperature of all the propagation segments be zero in order to achieve zero total temperature coefficient of delay is accurate only for right-angle reflections and only for a pure-mode reflected wave. For more general geometries, the rotation of the reflectors with temperature and velocity anisotropy about the reflected direction must be taken into account. FIG. 5 illustrates the general geometry to be considered. The total phase delay, $\tau$, from input to output transducers is $$\tau = (L_x - L_t\sin\theta)/v_x + L_t/v_t \qquad (4)$$

where $L_x$, $L_t$, and $\theta$ are defined in FIG. 5, $v_x$ is the x-directed phase velocity, and $v_t$ is the t-directed ("transverse" or reflected direction) phase velocity. The first order differential in phase delay with temperature, T, is thus $$\frac{\delta\tau}{\delta T} = \tau\Gamma_\tau = (\gamma_{Lx} - \gamma_{vx}) L_x/v_x$$
$$- (\Gamma_{Lt} - \gamma_{vx} + \Gamma_\theta \cot\theta) L_t \sin\theta/v_x \qquad (5)$$
$$+ (\Gamma_{Lt} - \Gamma_{vt}) L_t/v_t.$$

The upper and lower case gammas are temperature coefficients for the denoted subscripts. The lower case gammas are fully reduced constants which are characteristic of the particular crystal cut and orientation. The upper case gammas depend on the lower case gammas through the device geometry. For example, $$\Gamma_\tau = \frac{\delta\tau}{\delta T}/\tau$$

$$\gamma_{vx} = \frac{\delta v_x}{\delta T}/v_x$$

$$\Gamma_T = \frac{\delta\theta}{\delta T}.$$

The coefficient $\Gamma_{Lt}$ is determined from the condition $L_t/L_z = \cos\alpha/\cos(\alpha+\theta)$, $$\Gamma_{Lt} = \gamma_{L,z} - \Gamma_\alpha \ (\tan\alpha - \tan(\alpha+\theta)) + \Gamma_\theta \ \tan(\alpha+\theta). \quad (6)$$

The velocity coefficient $\Gamma_{vt}$ is determined from Snells Law, $v_t/v_x = \sin(\alpha+\theta)/\cos\alpha$, $$\Gamma_{vt} = \gamma_{vx} + \Gamma_\alpha \ (\cot(\alpha+\theta) + \tan\alpha) + \Gamma_\theta \ \cot(\alpha+\theta). \quad (7)$$

Alternatively $\Gamma_{vt}$ can be expressed in terms of the velocity anisotropy, $\beta = (\delta_{vt}/\delta\theta)/v_t$, $$\Gamma_{vt} = \gamma_{vt} + \beta\Gamma \quad (8)$$

Using (6) and (7) $\Gamma_\theta$ is found to be $$\Gamma_{\theta_{(\alpha+\theta)}} = (\gamma_{vx}+\Gamma_\alpha \ (\cot(\alpha+\theta) + \tan\alpha) - \gamma_{vt})/(\beta-\cot(\alpha+\theta)). \quad (9)$$

Finally the grating angle rotation coefficient is $$\Gamma_\alpha = \frac{1}{2} \sin 2\alpha \ \gamma_{\tan\alpha} = \frac{1}{2} \sin 2\alpha(\gamma_{L,z} - \gamma_{L,x}). \quad (10)$$

For the special case where the reflection is right-angle ($\theta=0$) the total TCD coefficient $\Gamma_T$ becomes $$\Gamma_T = \frac{\tau_x}{\tau} \gamma_{Tx} + \frac{\tau_z}{\tau} \gamma_{Tz} - \frac{\tau_z}{\tau} (\gamma_{vz} - \gamma_{vx} - \Gamma_\alpha(\tan\alpha + \cot\alpha)) (\beta \tan\alpha/(1-\beta\tan\alpha)). \quad (11)$$

When the reflected direction is pure mode ($\beta=0$) this reduces further to $$\Gamma_T = \frac{\tau_x}{\tau} \gamma_{Tx} + \frac{\tau_z}{\tau} \gamma_{Tz}. \quad (12)$$

For 90° reflection from $x$ into $z$ on y-cut quartz both the $\theta=0$ and $\beta=0$ conditions are satisfied so that the condition for zero TCD, $\Gamma_T = 0$ is $$\tau_x/\tau_z = -\gamma_{Tz}/\gamma_{Tx} \quad (13)$$

As noted previously, the overall response for the periodic grating filter is determined by the combined effects of the transducer and reflective grating responses. The transducers are required only to perform efficient transduction while the gratings perform mode selection and temperature stabilization.

Several desirable features are combined to arrive at an optimum transducer design. First, the transducer aperture is set by the grating width. Since the transducer is not required for mode selection, its bandwidth can be significantly larger than the mode spacing. A small number of transducer periods consistent with low conversion loss is compatible with a desire to maintain a small total metallized area. The transducer characteristics with series inductive tuning for the design chosen are given in Table I.

TABLE I

| TRANSDUCER CHARACTERISTICS | |
|---|---|
| GEOMETRY | |
| Aperture | 100 λ |
| Length | 20 λ |

TABLE I-continued

| TRANSDUCER CHARACTERISTICS | |
|---|---|
| EQUIVALENT SERIES CIRCUIT ELEMENTS | |
| Transducer Capacitance, $C_T$ | 3.44 pF |
| Radiation Resistance, $R_a$ | 21 Ω |
| Finger Resistance, $R_c$ | 5 Ω |
| Tuning Inductance | .725 μH |
| Inductor Resistance, $R_L$ | 19 Ω |
| Parasitic Shunt Capacitance, $C_p$ | .26 pF |
| TWO-PORT INSERTION LOSS | 12.7 dB |
| CENTER FREQUENCY | 97.2 MHz (25° C) |

The characteristics of the reflective gratings are shown in Table II.

TABLE II

| REFLECTIVE GRATING CHARACTERISTICS | |
|---|---|
| GROOVE GEOMETRY | |
| Orientation | 50.33° from X |
| Width/period | .57 |
| Depth | 0.200 μm |
| OVERALL CHARACTERISTICS | |
| Width | 100 λ |
| Length | 100 λ |
| Reflection loss (pair) | 4 dB |
| Center Frequency | 96.9 MHz (25° C) |

The orientation of the reflectors was chosen so that the incident x-directed Rayleigh wave scatters into the z-directed Rayleigh wave. In order to achieve minimum reflection loss without severe multiple reflection distortions (4dB), an accurate determination of the single groove reflectivity is required. The single groove reflectivity, $r$, at the grating resonance for right-angle reflection ion-etched grooves can be expressed as $$r = K(h/p)\sin(\pi s/p), \quad (14)$$

where $s$ is the groove width, $p$ is the groove period along the indicent direction, $h$ is the groove depth and $K$ is a constant. The coefficient $K$ was determined by measuring the centerband loss due to the gratings for both the T (transmission) and Z (reflection) paths on a number of devices with groove depths ranging from 0.16 μm to 0.70 μm. The groove depths were measured to a precision of 50 A with a profilometer. The ratio $s/p$, measured with a phase contract microscope, was consistently around 0.57 ±5%. The value of $k$ for Rayleigh wave scattering between the $x$ and $z$ directions on Y-cut quartz was thus determined as $$K_{xz} \text{ (y-cut Quartz)} = 1.67 \pm 0.05 \quad (15)$$

Figure 6:
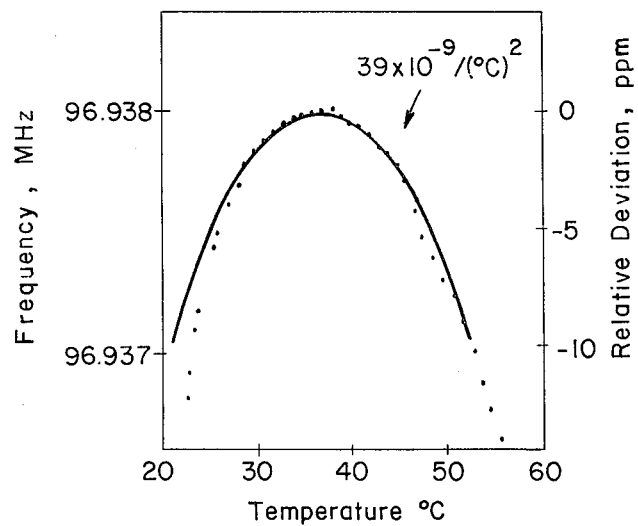
FIG. 6 is a graphic illustration showing frequency versus temperature for a periodic grating oscillator with a turn-around temperature of 37° C.

Shown in FIG. 6 is the variation in oscillator frequency with temperature, with only the grating filter undergoing temperature cycling. The quadratic coefficient is somewhat larger than but comparable to that of ST-quartz. The turn-around temperature can be varied by small changes in the path length ratio. If the number of wavelengths along $z$, $n_z$, is held constant then the variation in $\Gamma_T$ with the path length along $x$ is $$\frac{\delta\Gamma_T}{\delta n_x}\bigg|_{n_z} = (\gamma_{Tx} - \gamma_{Tz})n_z/(n_x + n_z)^2 \quad (16)$$

Assuming that $\Gamma_T$ varies linearly with temperature, $$\Gamma_T = \Gamma_{T_0} + \Gamma'(T-T_{00}), \quad (17)$$

where $T_{00}$ is a reference temperature, the variation in turn-around temperature, $T_o$, $[\Gamma_T(T_o) = 0]$ with $n_x$ is $$\frac{\delta T_o}{\delta n_x} \bigg|_{n_z} = -\frac{1}{\Gamma'} \frac{\delta \Gamma_T}{\delta n_x} \bigg|_{n_z} \quad (18)$$

which at $T_o$ reduces to $$\frac{\delta T_o}{\delta n_x} \bigg|_{n_z} = -\gamma_{Tx}/\Gamma'(n_x + n_z) \quad (19)$$

Figure 7:
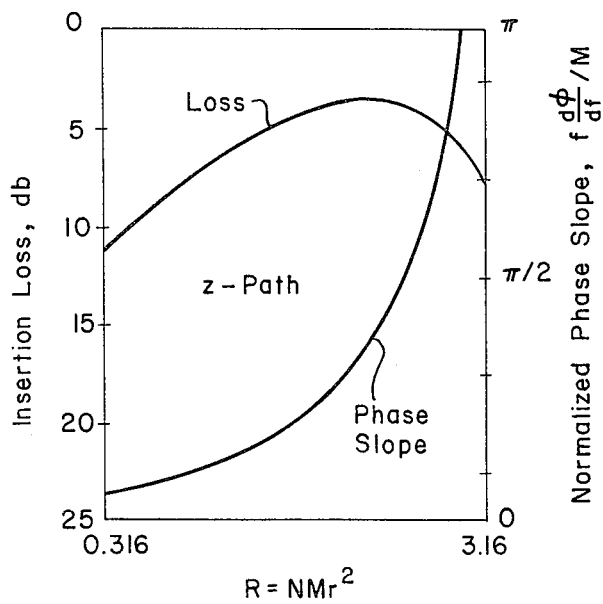
FIG. 7 is a graphic illustration showing insertion loss and phase slope for a Z-path reflection.

Based on our measurements of $\gamma_{Tx}$ and $\Gamma'$, $T_o$ varies about 0.4° C per wavelength change along $x$. Also, the location of $T_o$ is influenced by the reflector depth through the phase versus frequency response of the grating. FIG. 7 shows the calculated variation of the grating phase scope versus grating reflectivity.

Figure 8:
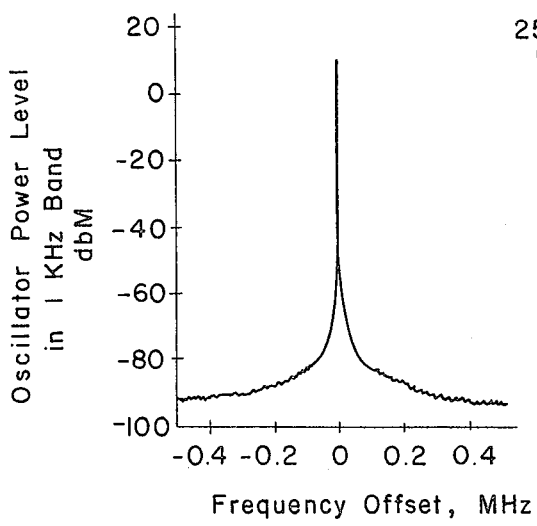
FIG. 8 illustrates graphically the oscillator line spectral content of the oscillator of FIG. 4.

The oscillator line spectral content is shown in FIG. 8. A 3 dB power divider followed the amplifier so that half of the power was tapped out while half recirculated. The output power at 96.916 MHz is +12 dBm. The peak-to-noise ratio at 100 kHz offset is 125 dB/Hz, with the classical 20 dB/decade FM noise to offset frequency slope. The oscillator noise joins the thermal noise floor at a frequency offset characteristic of the grating filter bandwidth rather than the loop delay.

In the periodic grating oscillator herein described, a number of oscillator modes are allowed within the grating filter bandwidth. This occurs because the total delay, constrained by the zero TCD condition is somewhat larger than the inverse of the grating bandwidth. Nonetheless, the oscillator spectrum is clean and free from spurious oscillations that could be expected at the various mode spacings (FIG. 8). The spurious-free nature of the oscillator line is due primarily to the saturation characteristics of the feedback amplifier 89. As seen in FIG. 4, the output of the oscillator may be provided by any conventional means such as a 3 dB coupler 91.

Figure 2:
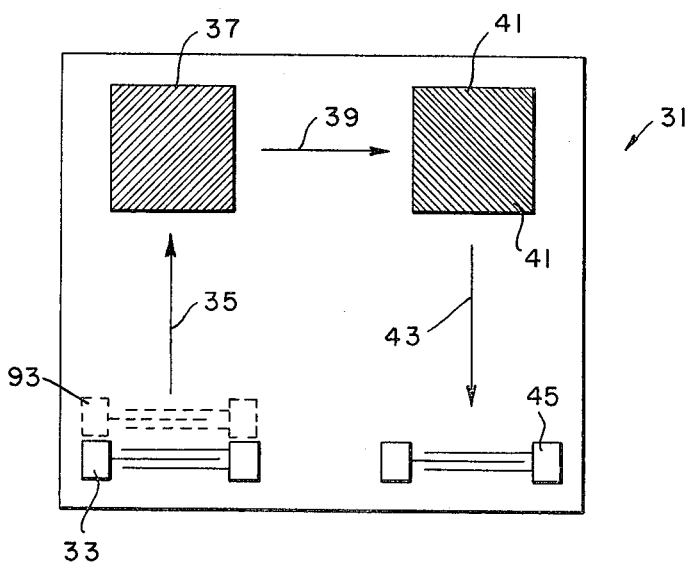
FIG. 2 is a schematic plan view of a temperature stable surface acoustic wave delay line having a U-shaped propagation path.

In accordance with yet another embodiment of the invention, the path length in one of the two directions having temperature coefficients of delay of opposite sign may be varied in order to provide a desired turn-around temperature with respect to frequency. In this embodiment a second input transducer 93 is disposed adjacent and aligned with the first input transducer 33 in FIG. 2 so that either transducer may be coupled to input electromagnetic energy. Although only two input transducers are shown, it should be understood that additional input and even output transducers may be utilized for this purpose.

From the foregoing, it should be evident that there has herein been described an efficient and highly advantageous temperature stable surface acoustic wave device which may be incorporated in the feedback path of an amplifier to provide a temperature stable feedback oscillator, for example.

It should be understood that the materials used to fabricate the various embodiments of the invention are not critical and any material exhibiting similar desired characteristics may be used.

Although the present invention has been shown and described with reference to particular embodiments, nevertheless various changes and modifications and other embodiments which are obvious to persons skilled in the art to which the invention pertains are deemed to lie within the spirit, scope and contemplation of the invention.

What is claimed is:

1. A temperature stable surface acoustic wave device, comprising:
   a substrate of material capable of supporting propagating surface acoustic wave energy in two directions in which the temperature coefficients of delay are of opposite sign;
   input means including an input transducer disposed on said substrate for converting input electromagnetic energy to surface acoustic wave energy in said substrate and for causing said surface acoustic wave energy to propagate in one of said directions;
   output means including an output transducer disposed on said substrate for converting surface acoustic wave energy incident thereon to output electromagnetic energy; and
   reflective grating means disposed on said substrate for reflecting surface acoustic wave energy from said input transducer propagating in said one of said directions to the other of said directions, and for directing said surface acoustic wave energy toward said output transducer, the path lengths of said surface acoustic wave energy propagating along said directions being predetermined to provide a total linear zero temperature coefficient of delay in said device.

2. The temperature stable surface acoustic wave device according to claim 1, wherein said reflective grating means includes first and second spaced reflective gratings, said first grating reflecting surface acoustic wave energy from said input transducer to said second grating, said second grating reflecting surface acoustic wave energy to said output transducer.

3. The temperature stable surface acoustic wave device according to claim 2, wherein said first and second gratings are orientated to define a Z-shaped propagation path between said input and output transducers.

4. The temperature stable surface acoustic wave device according to claim 2, wherein said first and second gratings are orientated to define a U-shaped propagation path between said input and output transducers.

5. The temperature stable surface acoustic wave device according to claim 2, wherein said material is y-cut quartz and said gratings are periodic.

6. The temperature stable surface acoustic wave device according to claim 2, wherein said material is y-cut quartz and said gratings are non-periodic.

7. The temperature stable surface acoustic wave device according to claim 1, wherein said reflective grating means includes a single reflective grating reflecting surface acoustic wave energy from said input transducer to said output transducer to define an L-shaped path therebetween.

8. The temperature stable surface acoustic wave device according to claim 1, also comprising means for selecting the path length in at least one of said directions to provide a desired turn-around temperature with respect to frequency.

9. A temperature stable surface acoustic wave feedback oscillator, comprising:

a substrate of material capable of supporting propagating surface acoustic wave energy in two directions in which the temperature coefficients of delay are of opposite sign;

input means including an input transducer disposed on said substrate for converting input electromagnetic energy to surface acoustic wave energy in said substrate and for causing said surface acoustic wave energy to propagate in one of said directions;

output means including an output transducer disposed on said substrate for converting surface acoustic wave energy incident thereon to output electromagnetic energy;

reflective grating means disposed on said substrate for reflecting surface acoustic wave energy from said input transducer propagating in said one of said directions to the other of said directions, and for directing said surface acoustic wave energy toward said output transducer, the path lengths of said surface acoustic wave energy propagating along said directions being predetermined to provide a total linear zero temperature coefficient of delay;

amplifier means having an input circuit coupled to said output transducer and having an output circuit coupled to said input transducer to define a feedback path including said propagating surface acoustic wave energy; and oscillator output means coupled to said feedback path for providing an output signal from said oscillator.

10. The temperature stable surface acoustic wave feedback oscillator according to claim 9, wherein said reflective grating means includes first and second spaced reflective gratings, said first grating reflecting surface acoustic wave energy from said input transducer to said second grating, said second grating reflecting surface acoustic wave energy to said output transducer.

11. The temperature stable surface acoustic wave feedback oscillator according to claim 10, wherein said first and second gratings are orientated to define a Z-shaped propagation path between said input and output transducers.

12. The temperature stable surface acoustic wave feedback oscillator according to claim 10, wherein said first and second gratings are orientated to define a U-shaped propagation path between said input and output transducers.

13. The temperature stable surface acoustic wave feedback oscillator according to claim 10, wherein said material is y-cut quartz and said gratings are periodic.

14. The temperature stable surface acoustic wave feedback oscillator according to claim 10, wherein said material is y-cut quartz and said gratings are non-periodic.

15. The temperature stable surface acoustic wave feedback oscillator according to claim 9, wherein said reflective grating means includes a single reflective grating reflecting surface acoustic wave energy from said input transducer to said output transducer to define an L-shaped path therebetween.

16. The temperature stable surface acoustic wave feedback oscillator according to claim 9, also comprising means for selecting the path length in at least one of said directions to provide a desired turn-around temperature with respect to frequency.

17. The temperature stable surface acoustic wave feedback oscillator according to claim 9, wherein said oscillator output means includes a 3 dB coupler.

* * * * *